United States Patent
Chen et al.

(10) Patent No.: US 7,168,020 B2
(45) Date of Patent: Jan. 23, 2007

(54) CIRCUIT AND METHOD FOR TESTING EMBEDDED PHASE-LOCKED LOOP CIRCUIT

(75) Inventors: Murphy Chen, Taipei (TW); Perlman Hu, Taipei (TW)

(73) Assignee: VIA Technologies, Inc., Shindian (TW)

( * ) Notice: Subject to any disclaimer, the term of this patent is extended or adjusted under 35 U.S.C. 154(b) by 622 days.

(21) Appl. No.: 10/352,439

(22) Filed: Jan. 28, 2003

(65) Prior Publication Data
US 2003/0172327 A1    Sep. 11, 2003

(30) Foreign Application Priority Data
Mar. 5, 2002    (TW)    ............... 091104077 A

(51) Int. Cl.
G01R 31/28    (2006.01)
H03K 5/22     (2006.01)
H03L 7/00     (2006.01)
H03L 7/06     (2006.01)
G01R 13/34    (2006.01)
G11C 27/00    (2006.01)

(52) U.S. Cl. .................. 714/724; 327/141; 327/147; 327/23; 324/76.58; 324/76.61

(58) Field of Classification Search .................. None
See application file for complete search history.

(56) References Cited

U.S. PATENT DOCUMENTS 5,381,085 A * 1/1995 Fischer ................ 324/76.48
5,581,699 A * 12/1996 Casal et al. ............... 714/55
5,781,038 A * 7/1998 Ramamurthy et al. ....... 327/23
5,889,435 A * 3/1999 Smith et al. ............. 331/1 A
6,094,236 A * 7/2000 Abe et al. ................ 348/731
6,185,510 B1 * 2/2001 Inoue ..................... 702/69
6,247,160 B1 * 6/2001 Davidsson et al. ......... 714/797
6,311,295 B1 * 10/2001 Casal et al. ............... 714/55

OTHER PUBLICATIONS

The TTL Data Book vol. 2: Texas Instruments, 1985, TI, vol. 2, p. 3-518.*

* cited by examiner

Primary Examiner—Albert Decady
Assistant Examiner—Steven D. Radosevich
(74) Attorney, Agent, or Firm—Volpe and Koenig, P.C.

(57) ABSTRACT

A method and a device for testing an embedded phase-locked loop (PLL) circuit are disclosed. A first clock signal of a first frequency is provided to an embedded phase-locked loop (PLL) circuit to be tested by a tester, so as to generate a PLL clock signal by the embedded PLL circuit in response to the first clock signal of the first frequency. The PLL clock signal is inputted to a test circuit along with a second clock signal of a second frequency. Then, the PLL clock signal is sampled with the second clock signal of the second frequency to generate a first sampled signal. The second frequency has a first correlation with the first frequency. Whether the embedded PLL circuit is in a normal operation condition is determined according to the first sampled signal.

7 Claims, 4 Drawing Sheets

CIRCUIT AND METHOD FOR TESTING EMBEDDED PHASE-LOCKED LOOP CIRCUIT

FIELD OF THE INVENTION

The present invention relates to a circuit for testing an embedded phase-locked loop (PLL) circuit, and more particularly to a testing circuit for diagnosing the clock of an embedded phase-locked, loop (PLL) circuit. The present invention also relates to a method for testing an embedded phase-locked (PLL) circuit to diagnose the PLL clock.

BACKGROUND OF THE INVENTION

Conventionally, test vectors are prevalently employed to screen out the unqualified chips. Since the parameters, such as the frequency, phase and duty cycle, of the clock inputted from a tester into the chip are precisely controlled, a specific test vector inputted into a normal chip is supposed to be outputted as expected. In other words, when the output of the chip in response to the specific test vector shows an unexpected result, the chip is determined to be an unqualified chip and should be ruled out.

Presently, a phase-locked loop (PLL) circuit is usually embedded in the chip for providing the clock signals of all required frequencies for the chip, thereby reducing the cost. Since the clock signal generated by the embedded PLL circuit is not a pure digital signal and its phase delay is unpredictable, there has been no specific test vectors, so far, and corresponding outputs for the embedded PLL circuit to perform test. Therefore, the embedded PLL circuit is not particularly tested in the prior art.

Therefore, the purpose of the present invention is to develop a circuit and a method for testing an embedded phase-locked loop (PLL) circuit to deal with the above situations encountered in the prior art.

SUMMARY OF THE INVENTION

An object of the present invention is to provide a method and a device for testing an embedded phase-locked (PLL) circuit to properly diagnose the embedded PLL circuit for reducing errors.

A first aspect of the present invention relates to a method for testing an embedded phase-locked loop (PLL) circuit. The method comprises steps of providing a first clock signal of a first frequency to an embedded phase-locked loop (PLL) circuit to be tested; generating a PLL clock signal by the embedded PLL in response to the first clock signal of the first frequency; sampling the PLL clock signal with a second clock signal of a second frequency to generate a first sampled signal, the second frequency has a first correlation with the first frequency; and determining whether the embedded PLL circuit is in a normal operation condition according to the first sampled signal.

In an embodiment, the second frequency is $2/(2n+1)$ times the first frequency, where n is zero or positive integer.

Preferably, the method further comprises steps of: sampling the first sampled signal to generate a second sampled signal with the second clock signal of the second frequency; and comparing the second sampled signal with the first sampled signal to acquire a comparing result.

In an embodiment, the embedded PLL circuit is determined abnormal when the comparing result indicates a second correlation between the first sampled signal and the second sampled signal is complied with. For example, the embedded PLL circuit is determined abnormal when the first sampled signal and the second sampled signal are of the same logic level at a certain sampling point.

Preferably, the method further comprises a step of asserting a logic high signal when the abnormal operation situation of the embedded PLL circuit is determined.

Preferably, the step of sampling the PLL clock signal with the second clock signal of the second frequency is performed in duplication so as to generate the first sampled signal and a second sampled signal, and the embedded PLL circuit is determined whether to be in the normal operation condition according to the first and second sampled signals. In this case, the method preferably further comprises steps of: sampling the first and second sampled signals to generate a third and a fourth sampled signals, respectively, in response to the second clock signal of the second frequency; comparing the third sampled signal with the first sampled signal to acquire a first comparing result; and comparing the fourth sampled signal with the second sampled signal to acquire a second comparing result. The embedded PLL circuit is determined abnormal when the first sampled signal and the third sampled signal are of the same logic level at a certain sampling point, and the second and fourth sampled signals are of the same logic level at the certain sampling point.

A second aspect of the present invention relates to a device for testing an embedded phase-locked loop (PLL) circuit. The device includes a phase-locked loop (PLL) circuit embedded in an IC chip for providing a PLL clock signal of a first frequency for the operation of the IC chip; and a test circuit electrically connected to the embedded PLL circuit, sampling the PLL clock signal with a test clock signal of a second frequency to generate a first-sampled signal, wherein the second clock frequency has a correlation with the first frequency, and the embedded PLL circuit is determined whether to be in a normal operation condition according to the first sampled signal.

Preferably, the test circuit is embedded in the IC chip.

In an embodiment, the embedded PLL circuit generates a test PLL clock signal in response to an external clock signal, and the embedded test circuit samples the test PLL clock signal with the test clock signal when the IC chip is under the testing procedure, and the external clock signal and the test clock signal are both provided by an external tester.

Preferably, the embedded test circuit comprises a first flip-flop receiving the test PLL clock signal, and outputting the first sampled signal in response to the test clock signal of the second frequency; a second flip-flop receiving the first sampled signal, and outputting a second sampled signal in response to the test clock signal of the second frequency; and a first XNOR gate receiving the first and the second sampled signals, and outputting a first index signal according to the first and the second sampled signals.

Preferably, the first XNOR gate outputs a logic high signal to indicate the abnormal condition of the embedded PLL circuit when the first and the second sampled signals are of the same logic levels.

Preferably, the test circuit further comprises a third flip-flop receiving the test PLL clock signal, and outputting a third sampled signal in response to the test clock signal of the second frequency; a fourth flip-flop receiving the third sampled signal, and outputting a fourth sampled signal in response to the test clock signal of the second frequency; and a second XNOR gate receiving the third and the fourth sampled signals, and outputting a second index signal according to the third and the fourth sampled signals.

Preferably, the second XNOR gate outputs a logic high signal to indicate the abnormal condition of the embedded PLL circuit when the third and the fourth sampled signals are of the same logic levels.

Preferably, the abnormal condition of the embedded PLL circuit is determined when both the first and the second index signals are logic high.

A third aspect of the present invention relates to a circuit for testing an embedded phase-locked loop (PLL) circuit. The test circuit comprises a first flip-flop receiving a PLL clock signal of a first frequency outputted by the embedded PLL circuit, and outputting a first sampled signal in response to a test clock signal of a second frequency; a second flip-flop receiving the first sampled signal, and outputting a second sampled signal in response to the test clock signal of the second frequency; and a first XNOR gate receiving the first and the second sampled signals, and outputting a first index signal according to the first and the second sampled signals.

Preferably, the circuit further comprises a third flip-flop receiving the PLL clock signal, and outputting a third sampled signal in response to the test clock signal of the second frequency; a fourth flip-flop receiving the third sampled signal, and outputting a fourth sampled signal in response to the test clock signal of the second frequency; and a second XNOR gate receiving the third and the fourth sampled signals, and outputting a second index signal according to the third and the fourth sampled signals.

Preferably, the circuit further comprises an AND gate receiving the first and second index signal to confirm the abnormal condition of the embedded PLL circuit only when both the first and the second index signals are logic high.

DESCRIPTION OF THE DRAWINGS

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

The present invention provides a method for testing an embedded phase-locked loop (PLL) circuit. First of all, a clock signal of a relatively low frequency is inputted to an embedded PLL circuit to be tested. After the embedded PLL circuit reaches a stable condition, the embedded PLL stably outputs a PLL clock signal in response to the clock signal of the low frequency. Subsequently, the PLL clock signal is sampled with a clock signal of a relatively high frequency to generate a sampled signal. According to the sampled signal, it is determined whether the embedded PLL circuit operates normally. If the embedded PLL circuit is in the normal operation, the clock signal outputted thereby toggles at a predetermined frequency with substantially 50% duty cycle. Hence, if the high frequency is 2 or $2/(2n+1)$ times the low frequency, where n is zero or positive integer, then one of two adjacent states of the sampled signal should be of a high level, i.e. logic 1, and the other is of a low level, i.e. logic 0. Accordingly, by comparing the logic levels of two successive states of the sampled signal, the toggling situation of the embedded PLL can be determined. On the other hand, if the duty cycle of the clock signal outputted from the embedded PLL circuit is much larger or smaller than 50%, for example larger than 75% or smaller than 25%, then the embedded PLL circuit is still considered "abnormal" even though the frequency of the outputted clock signal is correct. In the case that the duty cycle is far away from 50%, the two successive sampled signals are likely to be of the same logic level, i.e. both logic 1 or both logic 0. Accordingly, the duty cycle can be determined on the basis of two successive sampled states of the clock signal. Therefore, it is easy to determine whether the embedded PLL circuit is in the normal operation condition by comparing the logic levels of two successive sampled signal states.

Figure 1:
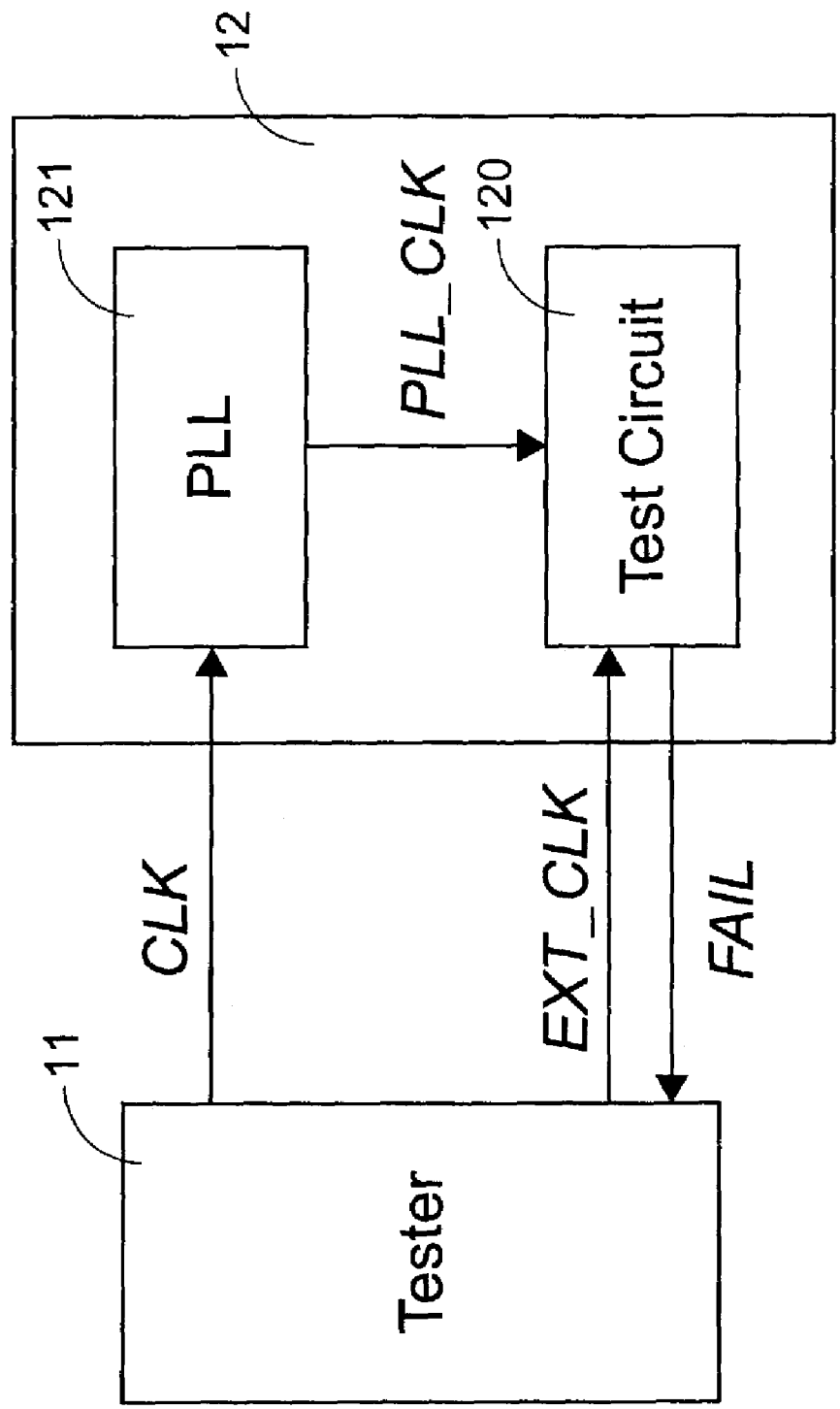
FIG. 1 is a schematic circuit block diagram illustrating a testing circuitry according to the present invention for diagnosing the PLL circuit embedded in a chip.

Please refer to FIG. 1 which is a schematic circuit block diagram including a test circuitry according to the invention. A test circuit 120 is integrated into the integrated circuit (IC) chip 12 and electrically connected to the embedded PLL circuit 121 to be tested. An external clock signal (CLK) from a tester 11 is transmitted to the PLL circuit 121, thereby generating the PLL clock signal (PLL_CLK). The tester 11 further provides another external clock signal (EXT_CLK) for the test circuit 120 for the test of the PLL clock signal (PLL_CLK). In this embodiment, both the PLL circuit 121 and the test circuit 120 are embedded in the chip 12. Alternatively, the test circuit 120 can be disposed outside the chip 12.

When performing a test on the chip 12, the tester 11 outputs a clock signal CLK into the embedded PLL circuit 121, and another clock signal EXT_CLK to the test circuit 120. After a predetermined time period, for example 2.05 ms, the embedded PLL circuit 121 oscillates stably. If the embedded PLL 121 operates normally, a stable clock signal PLL_CLK will be outputted in response to the clock signal CLK. For the purpose of test, the clock signal PLL_CLK is transmitted to the test circuit 120. The duty cycle of the clock signal EXT_CLK is 50% and the frequency thereof is, for example, twice that of the clock signal PLL_CLK. After receiving the clock signal PLL_CLK from the embedded PLL 121 and the clock signal EXT_CLK from the tester 11, the test circuit 120 outputs an indication signal FAIL to the tester 11. If the indication signal FAIL is at a high level, i.e. logic "1", the embedded PLL circuit 121 is determined to operate abnormally by the tester 11. On the contrary, if the indication signal FAIL is at a low level, i.e. logic "0", the embedded PLL circuit 121 is determined to be in normal operation. In practice, the frequency of the clock signal EXT_CLK can be $2/(2n+1)$ times that of the clock signal PLL_CLK, where n is zero or positive integer.

Figure 2:
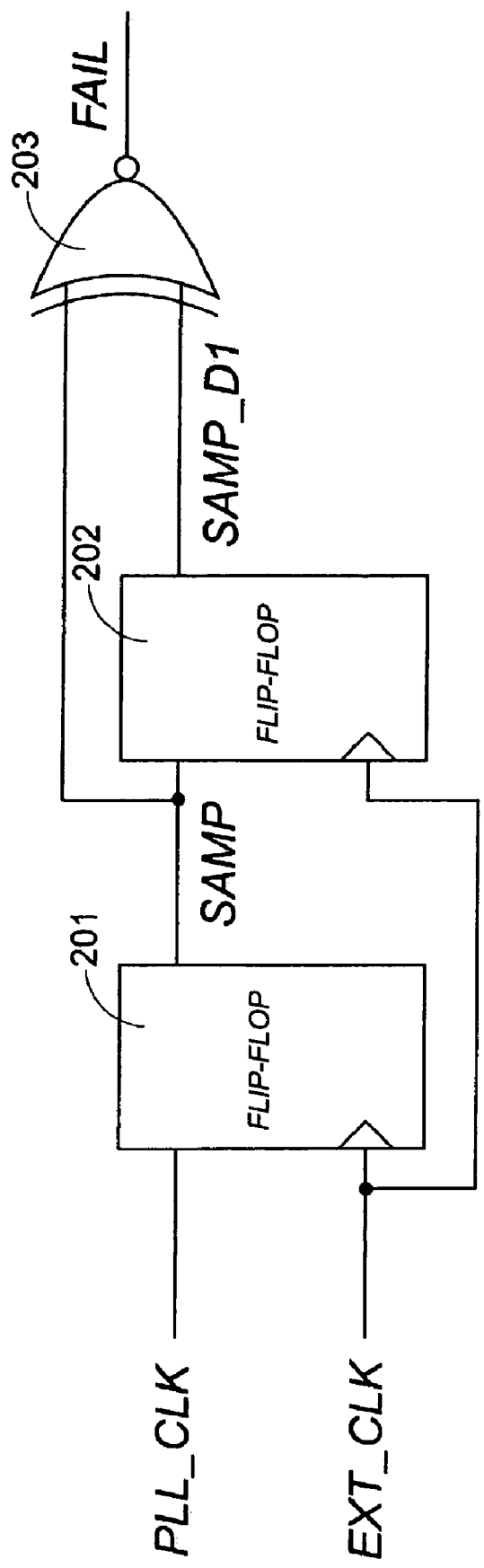
FIG. 2 is a circuit block diagram illustrating a preferred embodiment of the test circuit of FIG. 1.

Please refer to FIG. 2 which is a circuit block diagram exemplifying the test circuit 120 in FIG. 1. The test circuit includes two flip-flops 201 and 202 and an XNOR gate 203. An input end of the flip-flop 201 is connected to the output end of the embedded PLL circuit (not shown) for receiving therefrom the clock signal PLL_CLK. Another input end of the flip-flop 201 is connected to the output end of the tester 11 (not shown) for receiving therefrom the clock signal EXT_CLK, and so is an input end of the flip-flop 202. The output end of the flip-flop 201 is connected to an input end of the flip-flop 202. The output ends of the flip-flops 201 and 202 are connected to the two input ends of the XNOR gate 203, respectively, and the output end of the XNOR gate 203 is connected to the testing end of the tester 11.

Figure 3:
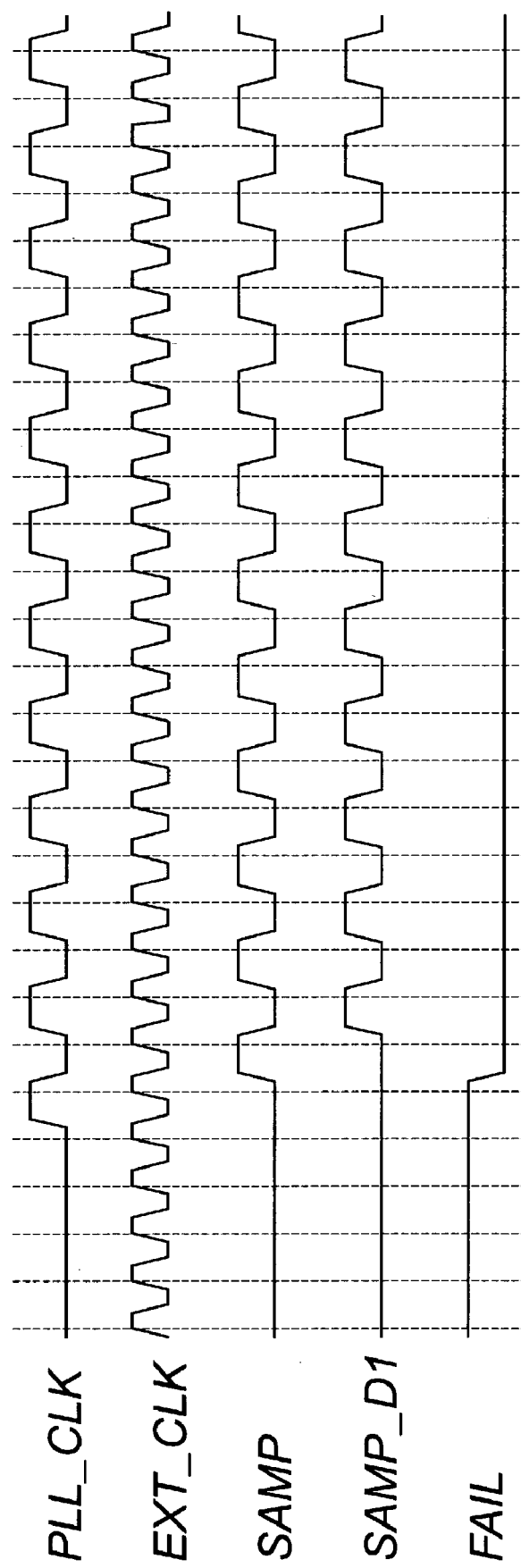
FIG. 3 is a schematic waveform diagram illustrating concerned signals in the IC chip according to the present invention.

Further refer to FIG. 3 showing a schematic waveform diagram illustrating concerned signals according to the present invention. Assume that the embedded PLL circuit 121 generates the clock signal PLL_CLK with a predetermined frequency stably. Since the frequency of the clock signal EXT_CLK is twice that of the clock signal PLL_CLK, the flip-flop 201 is triggered twice every cycle of the clock signal PLL_CLK. Thus, the sampled signal SAMP outputted from the flip-flop 201 toggles, and has a period twice that of the clock signal EXT_CLK from the tester 11. That is, the SAMP toggles with the same frequency as the clock signal PLL_CLK. Similarly, since the frequency of the clock signal EXT_CLK is twice that of the sampled signal SAMP outputted by the flip-flop 201, the flip-flop 202 is triggered twice every cycle of the sampled signal SAMP. Hence, the sampled signal SAMP_D1 outputted from the flip-flop 202 toggles, and has a frequency twice that of the EXT_CLK from the tester 11.

In addition, since both the sampled signals SAMP from the flip-flop 201 and SAMP_D1 from the flip-flop 202 are triggered in response to the clock signal EXT_CLK from the tester 11, they have the same frequency. Since the starting operation of the flip-flop 202 lags behind the flip-flop 201 by one cycle of the clock signal EXT_CLK. the sampled signal SAMP_D1 is delayed by one cycle of the clock signal EXT_CLK. Thus, the waveforms of the sampled signals SAMP and SAMP_D1 are in inverse phase as shown in FIG. 3.

The sampled signals SAMP and SAMP_D1 are transmitted to the XNOR gate 203, as shown in FIG. 2, and the XNOR gate 203 performs an XNOR operation on them and then outputs an indication signal FAIL. Due to the inverse phase of the two sampled signals, the indication signal FAIL is logic "0". The low level of the indication signal FAIL indicates the embedded PLL circuit 121 operates normally. On the other hand, if the embedded PLL circuit 121 abnormally operates, the output signal FAIL will be logic "1".

For example, if the output signal of the embedded PLL circuit is kept at logic "0", i.e. not toggling at all, the sampled signals SAMP and SAMP_D1 are both be logic "0". Through the operation of the XNOR 203, the output of logic "1" is obtained, and the high level of the indication signal FAIL indicates the abnormal operation, i.e. untoggling in this case. Therefore, the invention can precisely determine whether the embedded PLL circuit operates normally or not according to the logic state of the output signal from the XNOR gate 203.

In another example, when the frequency of the clock signal PLL_CLK is not as stable as expected, the embedded PLL circuit 121 is determined abnormal according to the following criterion. If the frequency of the clock signal PLL_CLK is not stable, the same logic status may happen for the sampled signals SAMP and SAMP_D1, i.e. both logic "1" or logic "0" at the same sampling point. Under this circumstance, the indication signal FAIL from the XNOR gate 203 becomes logic "1", and the abnormal condition of the PLL circuit 121 is indicated. For example, after one million cycles of the clock signal EXT_CLK, the logic "1" status of the indication signal FAIL may happen. Of course, it can be determined that the embedded PLL circuit 121 normally operates if the indication signal from the XNOR gate 203 always keeps at logic "0" for a predetermined time period.

Moreover, when the duty cycle of the clock signal PLL_CLK is much larger or much smaller than 50%, e.g. larger than 75% or smaller than 25%, the sampled signals SAMP and SAMP_D1 are possibly at logic "1" or logic "0" simultaneously because the adjacent half-cycles of the jittering signal PLL_CLK are sampled with the ideal double frequency signal EXT_CLK. Under this circumstance, the indication signal FAIL outputted from XNOR gate 203 is logic "1", and the abnormal condition of the PLL circuit 121 is indicated. In other words, when the duty cycle of the clock signal PLL_CLK is far away from 50%, the embedded PLL circuit 121 is considered abnormal even though the frequency of the PLL_CLK is as stable as expected. Of course, it can be determined that the embedded PLL 121 normally operates in response to the continuous low-level state of the indication signal FAIL from the XNOR gate 203.

Figure 4:
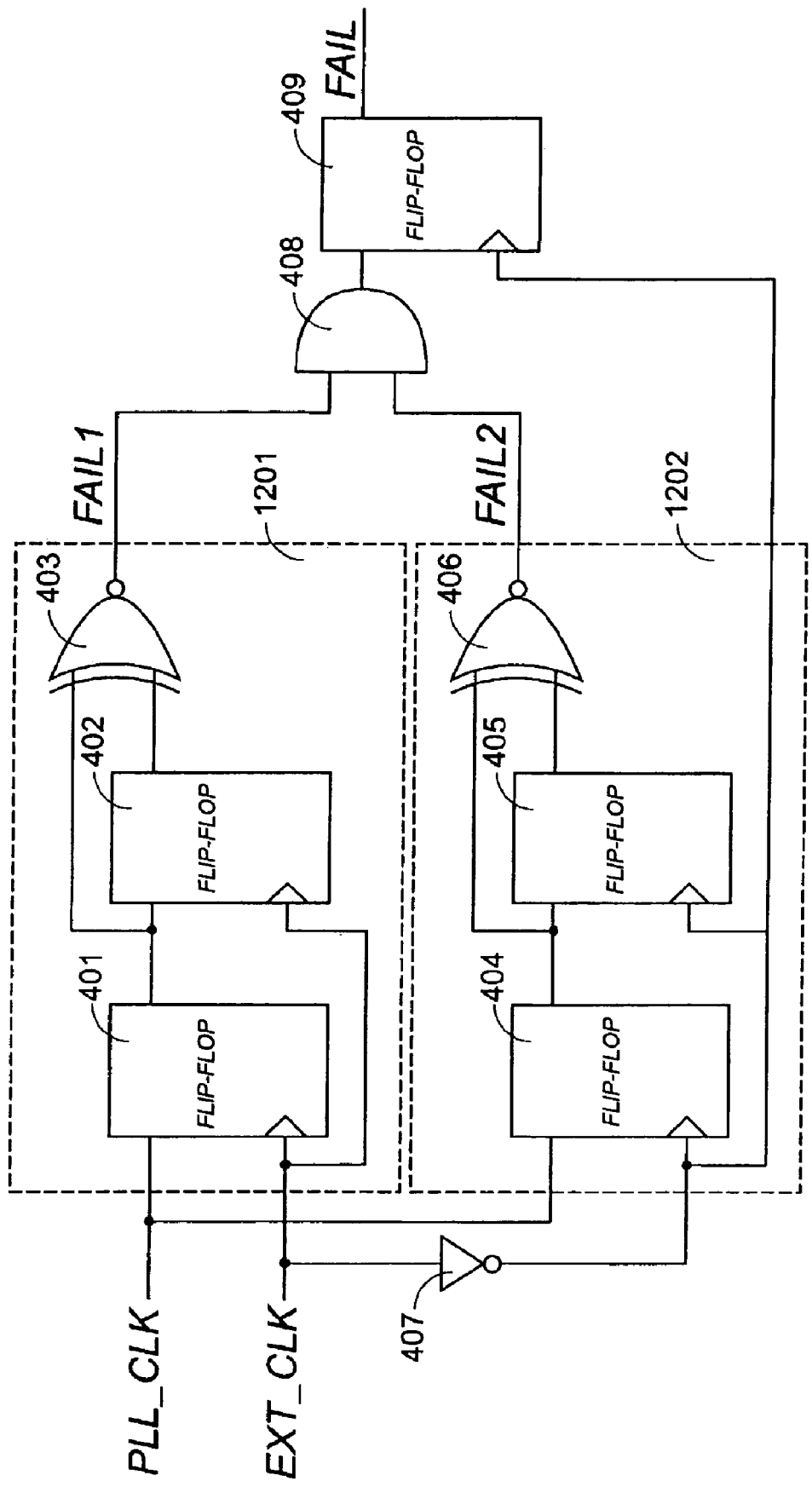
FIG. 4 is a circuit block diagram illustrating another preferred embodiment of the test circuit of FIG. 1.

Please refer to FIG. 4 which is a circuit block diagram illustrating another preferred embodiment of the test circuit 121 of FIG. 1. The test circuit includes two sub-circuits 1201 and 1202, a inverter 407, an AND gate 408 and an output flip-flop 409. The sub-circuit 1201 includes two flip-flops 401 and 402 and an XNOR gate 403, and the sub-circuit 1202 includes two flip-flops 404 and 405 and an XNOR gate 406. The duplication of the sub-circuits 1201 and 1202 double checks the testing procedure, and assures of the accuracy of the test system.

Two respective input ends of the flip-flops 401 and 404 are both connected to the output end of the embedded PLL (not shown in FIG. 4) for receiving therefrom the clock signal PLL_CLK. The other input ends of the flip-flops 401 and 404 are both connected to the output end of the tester (not shown in FIG. 4) for receiving therefrom the clock signal EXT_CLK. The output ends of the flip-flops 401 and 404 are connected to two input ends of the flip-flops 402 and 405, respectively. The other input ends of the flip-flops 404 and 405 are connected to the output end of the inverter 407. The input end of the inverter 407 is connected to the tester (not shown in FIG. 4) for receiving therefrom the clock signal EXT_CLK. The output ends of the flip-flops 401 and 402 are connected to the two input ends of the XNOR gate 403, respectively. The output ends of the flip-flops 404 and 405 are connected to the two input ends of the XNOR gate 406, respectively. The output ends of the XNOR gates 403 and 406 are connected to the two input ends of the AND gate 408, respectively. The output end of the AND gate 408 is connected to the input end of the output flip-flop 409 which has another input end connected to the output end of the inverter 407, as shown in FIG. 4. The output end of the inverter 407 is further connected to the tester 11 for outputting therefrom the indication signal FAIL.

The structure and function of each of the sub-circuits 1201 and 1202 are similar to those of the test circuit 120 of FIG. 1. Since the phase of the clock signal EXT_CLK is shifted by 180 degrees by the inverter 407, the time points for sampling the clock signals PLL_CLK are different for the test circuits 1201 and 1202, and the time difference therebetween is a half cycle of the clock signal EXT_CLK. The inverter 407 functions for staggering the sampling time points of the sub-circuits 1201 and 1202, for example, by a half cycle of the clock signal EXT_CLK. By this way, while one of the sub-circuits 1201 and 1202 samples at a transistion state of the clock signal PLL_CLK, which possibly causes an error, the other samples within the stable range of the clock signal PLL_CLK, which will obtain a correct result.

When the embedded PLL circuit is under the normal operation condition to generate a stable and predetermined frequency, both outputs FAIL1 and FAIL2 of the sub-circuits 1201 and 1202 are logic "0". Since both the input ends of the AND gate 408 are logic "0", the input end of the output flip-flop 409 connected to the AND gate 408 is logic "0". Accordingly, the flip-flop 409 outputs logic "0" to the test end of the tester 11 in response to the reverse clock signal EXT_CLK.

Even when one of the sub-circuits 1201 and 1202 samples at a time point around the transistion state, which possibly causes an error, the other samples at the stable range of the clock signal PLL_CLK, which will obtain a correct result. In other words, no matter what logic state is rendered for the sub-circuit 1201 or 1202, either "0" or "1", the other sub-circuit always outputs logic "0". Under this circumstance, through the AND gate 408, a logic "0" status will be guaranteed at the input end of the output flip-flop 409, resulting in the output of a logic "0" from the output flip-flop 409 to the test end of the tester 11 in response to the clock signal EXT_CLK.

On the contrary, when both the sub-circuits 1201 and 1202 output logic "1" to the two input ends of the AND gate 408, the embedded PLL circuit is determined to be under an abnormal operation condition. Since both input ends of the AND gate 408 are at logic "1", a logic "1" status is rendered at the input end of the output flip-flop 409, resulting in that the output flip-flop 409 outputs logic "1" to the test end of the tester 11 in response to the reverse clock signal EXT-CLK. In practice, the abnormal operation condition may include signal drift, signal delay and/or signal jitter.

According to this embodiment using two sub-circuits 1201 and 1202 and the AND gate 408 to prevent over-killed, an output of logic "1" from the AND gate 408 to the tester 11 will be rendered only when both input ends of the AND gate 408 are logic "1". Moreover, in a case that glitches occasionally occur at the circuit output end, the erroneous indication can be prevented by sampling the output flip-flop 409 only at the triggered moment. It should be understood that the probability of simultaneous occurrence of the glitch and the sampling operation is extremely low, so the output flip-flop 409 may be used for eliminating the glitch to reduce the erroneous indication of the tester 11.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A device for testing an embedded phase-locked loop (PLL) circuit embedded in an IC chip, comprising:
    an external tester disposed outside said IC chip for providing an external clock signal for said PLL circuit to generate a test PLL clock signal of a first frequency, and additionally providing a test clock signal of a second frequency;
    a test circuit electrically connected to said embedded PLL circuit and said tester for, sampling said PLL clock signal with said test clock signal to generate a first sampled signal, sampling said first sampled signal with said test clock signal to generate a second sampled signal, and logically operating said first sampled signal and said second sampled signal, wherein said second clock frequency has a correlation with said first frequency, and a logic operational result of said first sampled signal and said second sampled signal is directly referred to by said external tester to determine whether said embedded PLL circuit is in a normal operation condition.

2. The device according to claim 1 wherein said test circuit is embedded in said IC chip.

3. The device according to claim 2 wherein said embedded test circuit comprises:
    a first flip-flop receiving said test PLL clock signal, and outputting said first sampled signal in response to said test clock signal of said second frequency;
    a second flip-flop receiving said first sampled signal, and outputting said second sampled signal in response to said test clock signal of said second frequency; and
    a XNOR gate receiving said first and said second sampled signals, and outputting said logic operational result of said first and said second sampled signals to said external tester.

4. The device according to claim 3 wherein said XNOR gate outputs a logic high signal to indicate the abnormal condition of said embedded PLL circuit when said first and said second sampled signals are of the same logic levels.

5. A device for testing an embedded phase-locked loop (PLL) circuit embedded in an IC chip, comprising:
    an external tester disposed outside said IC chip for providing an external clock signal for said PLL circuit to generate a test PLL clock signal of a first frequency, and additionally providing a first test clock signal of a second frequency;
    a test circuit electrically connected to said embedded PLL circuit and said tester for sampling said PLL clock signal with said first test clock signal to generate a first sampled signal, sampling said first sampled signal with said first test clock signal to generate a second sampled signal, sampling said PLL clock signal with a second test clock signal to generate a third sampled signal, sampling said third sampled signal with said second test clock signal to generate a fourth sampled signal, and logically operating said first, second, third and fourth sampled signals to obtain a logic operational result, wherein said second clock frequency has a correlation with said first frequency, said second test clock signal is derived from said first test clock signal and has a frequency equal to said second frequency, and said logic operational result is directly referred to by said external tester to determine whether said embedded PLL circuit is in a normal operation condition.

6. The device according to claim 5 wherein said embedded test circuit further comprises:
    an inverter for inverting said first test clock signal into said second test clock signal;
    a first flip-flop receiving said test PLL clock signal, and outputting said first sampled signal in response to said first test clock signal;
    a second flip-flop receiving said first sampled signal, and outputting said second sampled signal in response to said first test clock signal; and
    a first XNOR gate receiving said first and said second sampled signals, and outputting a first index signal according to a logic operational result of said first and said second sampled signals;

a third flip-flop receiving said test PLL clock signal, and outputting said third sampled signal in response to said second test clock signal;

a fourth flip-flop receiving said third sampled signal, and outputting said fourth sampled signal in response to said second test clock signal;

a second XNOR gate receiving said third and said fourth sampled signals, and outputting a second index signal according to a logic operational result of said third and said fourth sampled signals; and an AND gate logically operating said first index signal and said second index signal to obtain an indication signal, and directly outputting said indication signal to said external tester to determine whether said embedded PLL circuit is in a normal operation condition.

7. The device according to claim 6 wherein the abnormal condition of said embedded PLL circuit is determined when both said first and said second index signals are logic high.

* * * * *